United States Patent
Wildhagen

(10) Patent No.: US 7,076,222 B2
(45) Date of Patent: Jul. 11, 2006

(54) DIGITAL CONTROLLED AGC

(75) Inventor: Jens Wildhagen, Weinstadt (DE)

(73) Assignee: SONY International (Europe) GmbH, Berlin (DE)

( * ) Notice: Subject to any disclaimer, the term of this patent is extended or adjusted under 35 U.S.C. 154(b) by 429 days.

(21) Appl. No.: 10/299,406

(22) Filed: Nov. 19, 2002

(65) Prior Publication Data

US 2003/0096587 A1    May 22, 2003

(30) Foreign Application Priority Data

Nov. 21, 2001    (EP) .................................. 01127362

(51) Int. Cl.
*H04B 1/06*    (2006.01)

(52) U.S. Cl. ................ 455/232.1; 455/234.1; 455/240.1; 455/234.2; 455/244.1

(58) Field of Classification Search ............ 455/234.2, 455/240.1, 244.1, 245.1, 272.1, 239.1, 306, 455/232.1, 230–231, 234.1, 235.1, 236.1, 455/219–225, 250.1, 126, 127.1, 127.2, 180.3, 455/181.1, 182.1, 183.1, 183.2, 191.3, 192.1, 455/192.2, 257–265, 311, 313, 323, 339–341, 455/248.1; 330/278–281; 375/141, 345

See application file for complete search history.

(56) References Cited

U.S. PATENT DOCUMENTS

| 5,887,246 | A * | 3/1999 | Chevallier et al. ........ 455/232.1 |
| 5,896,423 | A * | 4/1999 | Okamoto .................... 375/345 |
| 6,259,391 | B1 * | 7/2001 | Pakravan et al. ............ 341/139 |
| 6,700,921 | B1 * | 3/2004 | Shibuta ........................ 375/141 |
| 6,795,559 | B1 * | 9/2004 | Taura et al. ................ 381/94.8 |
| 6,795,694 | B1 * | 9/2004 | Uesugi ........................ 455/126 |
| 6,823,028 | B1 * | 11/2004 | Phanse ........................ 375/345 |
| 2001/0055350 | A1 * | 12/2001 | Higure ........................ 375/345 |
| 2002/0054583 | A1 * | 5/2002 | Olesen et al. ................ 370/336 |
| 2003/0083031 | A1 * | 5/2003 | Eriksson et al. ......... 455/250.1 |
| 2003/0148745 | A1 * | 8/2003 | Nystrom et al. ............ 455/136 |
| 2003/0157915 | A1 * | 8/2003 | Atkinson et al. ........... 455/306 |
| 2003/0207674 | A1 * | 11/2003 | Hughes .................... 455/234.1 |

FOREIGN PATENT DOCUMENTS

| DE | 40 36 730 | 5/1992 |
| EP | 0 569 688 | 11/1993 |

OTHER PUBLICATIONS

Patent Abstracts of Japan vol. 1999, No. 11, Sep. 30, 1999 & JP 11 148950 A (Oki Electric Ind Co Ltd), Jun. 2, 1999.
Cascade 1—Gain Distribution *"Radio Receiver Design"* pp. 691-695.

* cited by examiner

*Primary Examiner*—Pablo N. Tran
(74) *Attorney, Agent, or Firm*—Oblon, Spivak, McClelland, Maier & Neustadt, P.C.

(57) ABSTRACT

An automatic gain control loop for a radio receiver, comprising a switchable lowpass filter (21) to reduce distortions in an analogue gain control signal (6) by switching said switchable lowpass filter (21) to a low time constant in case a change of a gain control signal (6) of the automatic gain control loop lies above a predetermined threshold, which low time constant is lower than a normally used time constant, comprises a hold unit (24) which affects that said switchable lowpass filter (21) uses said low time constant a predetermined time after a change of the gain control signal (6) of the automatic gain control loop lies below said predetermined threshold.

7 Claims, 5 Drawing Sheets

DIGITAL CONTROLLED AGC

The invention is related to an automatic gain control unit comprising a voltage-controlled amplifier, whereby the gain of said voltage-controlled amplifier is controlled by a closed-loop control circuit, and to a receiver comprising such an automatic gain control loop. Furthermore, the invention is related to a method for automatic gain control with a gain control loop for a radio receiver.

In an automatic gain control unit, an amplifier's gain is regulated by means of a closed-loop control circuit. The gain is controlled such that the magnitude of the amplifier's output signal is about equal to a given reference magnitude. The closed-loop control circuit transforms the deviation of the amplifier's output signal amplitude into a corresponding gain control signal.

Technical background with respect to automatic gain control units can be found in "Radio receiver design" by K. McClaning and T. Vito, Noble Publishing Corporation, Atlanta, 2000.

FIG. 3 depicts a state of the art digital automatic gain control unit or loop (in the following also referred to as AGC). A RF signal 2 which is received by an antenna 1 is downconverted 3 to an IF signal 4. The IF signal 4 is subjected to the automatic gain control by being processed in an voltage controlled amplifier (VCA) 5 which controls the magnitude of its output signal 7 on basis of an analogue gain control signal 6, whereafter it is sampled by an analogue to digital converter (ADC) 8. This gain controlled and digitized IF signal 9 is further processed in the receiver, e.g. IQ-generation, demodulation, . . . 10.

The AGC loop which generates the analogue gain control signal 6 on basis of the digitized IF signal 9 might contain a digital control circuit 11, 13, 14, 16, 19 for the control of the AGC loop bandwidth. This control allows to achieve different attack, hold and decay time constants of the AGC loop.

The digital control circuit shown in FIG. 3 comprises an absolute value determination unit 11 which receives the digitized IF signal 9 and which determines the magnitude 12 of said digitized IF signal 9. The magnitude 12 always has a positive sign. An adder 13 subtracts a predefined reference magnitude 14 from said magnitude 12 of the digitized IF signal 9. As a result of the subtraction, the adder 13 provides an error signal 15 indicating the deviation of the VCA output signal's magnitude 12 from the reference magnitude 14. The error signal 15 is filtered by a digital lowpass filter 16, which generates a digital gain control signal 17. A time constant 18 of the digital lowpass filter 16 is provided by a time constant control circuit 19 which generates said time constant 18 on basis of the magnitude 12 of said digitized IF signal 9 and forwards it to the digital lowpass filter 16. The time constant 18 defines how fast the error signal 15 is converted into a corresponding change of the digital gain control signal 17. The determination of the time constant 18 as a function of the magnitude 12 of the VCA output signal is further shown in the applicants european patent application 01 122 979 "Automatic Gain Control" which content is herewith incorporated into this specification by reference.

The digital gain control signal 17 is converted into the analogue gain control signal 6 by a digital to analogue converter (DAC) 20. The analogue gain control signal 6 gets lowpass filtered by an analogue lowpass filter 21 before being input to said VCA 5.

The overall AGC loop consists of two lowpass filters 16, 21. The digital lowpass filter 16 is required for the digital control of the AGC loop. The other, analogue lowpass filter 21 is required to reduce distortions in the analogue gain control signal 6 caused for example by the DAC 20. Distortions in the analogue gain control signal 6 lead to distortions in the demodulated signal. A narrow analogue lowpass filter 21 reduces these distortions, but on the other hand, the AGC loop might become instable. A wide analogue lowpass filter 21 allows to design a stable and fast AGC loop, but the distortions caused by the DAC 20 might disturb the output signal 7 of the VCA 5.

The DAC 20 produces distortions in the analogue gain control signal 6, i.e. the control voltage of the voltage controlled amplifier. Mainly two different distortions occur:

Glitch distortions

Distortions caused by the step of the DAC 20.

The glitch distortions are relatively small and contain mainly high frequency energy that can easily be suppressed by the analogue lowpass filter 21.

The distortions in the output signal of the DAC 20 caused by the limited resolution of the DAC 20 are more critical.

FIG. 4 depicts the analogue gain control signal 6 supplied to the VCA 5. Depending on the time constant Tau of the analogue lowpass filter 21, which might be realized as an RC-filter, the analogue gain control signal 6 input to the VCA 5 has a faster or slower transient between two output levels of the DAC 20. In this example, the possible output levels of the DAC 20 are 0, 0.5 and 1.

Depending on the receiver input signal, the transients in the analogue AGC gain control signal 6 and therefore transients in the gain of the receiver input signal lead to distortions in the demodulated signal. In case of a digital FM receiver, a fast gain change leads to distortions in the frequency demodulated signal. The FM signal itself is insensitive to amplitude distortions. The channel selectivity filter transforms the amplitude distortions of the FM signal into phase distortions. This phase distortions of the FM signal lead to distortions of the frequency demodulated signal.

In order to avoid these distortions, the gain changes of the analogue gain control signal 6 input to the VCA 5 should be as smooth and slowly as possible. This can be achieved, for example, by the control of the VCA 5 with a high resolution DAC 20, e.g. 48 instead of three different output levels. This solution is expensive and therefore not the preferred solution. Another possibility is to select a high time constant for the analogue filter 21. FIG. 4 shows that the analogue gain control signal 6 input to the VCA 5 is more smooth in case of a high time constant Tau.

On the other side, a high time constant Tau of the analogue filter 21 might lead to instabilities of the AGC loop (especially in case a fast attack time of the AGC loop is required). A PID (proportional, integrational, differential) control of the AGC loop reduces this problem, but the differential part of the output signal of the DAC 20 requires a high dynamic range of the DAC 20.

Another possibility is to switch the time constant Tau of the analogue filter 21. This concept is also used according to the present invention. Preferably, the time constant Tau of the analogue filter 21 is controlled by the differential part of the output signal of the DAC 20. In case the analogue gain control signal 6 input to the VCA 5 changes fast, a low time constant of the analogue filter 21 is chosen. This control combines the low distortions in the VCA input signal in case of low gain changes and the fast reaction time of the AGC control loop.

The switchable time constant Tau of the analogue lowpass filter 21 can, for example, be realized by switching of the resistor of a RC lowpass filter (resistor-capacitor filter).

However, such a switching of the time constant depending on the differential part of the gain controlled and digitized IF signal 9, i.e. the AGC loop output signal, does not always lead to sufficient results. In case the differential part of the AGC loop output signal is high, the time constant Tau of the analogue filter 21 is reduced. As soon as the differential part of the AGC output signal is low, the time constant Tau is switched back to the high time constant. This control is critical, as can be derived from FIG. 5. The figure depicts the gain controlled and digitized IF signal 9 output by the ADC 8. The input signal of the AGC loop is a sinusoidal signal with constant amplitude. At t=0 the receiver is switched on and the AGC loop reduces the gain. At t=4.5 ms, the amplitude of the sinusoidal signal is increased by 20 dB. The AGC reduces the gain very fast. During this time, the low analogue time constant Tau is selected. Beginning from t=5 ms, the time constant Tau is increased so that the loop does not output a stationery control signal. Therefore, the response time of the AGC loop is relatively long, here more than 15 ms are needed after the 20 dB increase of the amplitude of the sinusoidal signal until the output signal is controlled to its desired level of 0.375.

Therefore, it is the object underlying the present invention to provide an improved automatic gain control loop for a radio receiver, a receiver with such an improved automatic gain control loop, an improved method for automatic gain control with a gain control loop for a radio receiver, and a computer program product performing at least parts of said method.

The automatic gain control loop for a radio receiver according to the present invention is defined in claim 1, the receiver according to the present invention is defined in claim 6, and the method for automatic gain control according to the present invention is defined in claim 8. Preferred embodiments thereof are respectively defined in the respective following subclaims. A computer program product according to the present invention is defined in claim 12.

The automatic gain control loop for a radio receiver according to the present invention, which radio receiver comprises a switchable lowpass filter to reduce distortions in an analogue gain control signal by switching said switchable lowpass filter to a low time constant in case a change of a gain control signal of the automatic gain control loop lies above a predetermined threshold, which low time constant is lower than a normally used time constant, comprises a hold unit which affects that said switchable lowpass filter uses said low time constant a predetermined time after a change of the gain control signal of the automatic gain control loop lies below said predetermined threshold.

An automatic gain control loop according to the present invention preferably comprises
  a voltage controlled amplifier receiving an analogue input signal of the automatic gain control loop and the analogue gain control signal to output an analogue output signal which equals to the analogue input signal of the automatic gain control loop amplified according to the analogue gain control signal,
  an analogue/digital converter receiving the analogue output signal and converting it to a digital output signal,
  a digital control circuit to determine a digital gain control signal on basis of the digital output signal, and
  a digital/analogue converter receiving the digital gain control signal and converting it to said analogue gain control signal which is filtered by said switchable lowpass filter before being supplied to said voltage controlled amplifier.

Alternatively or additionally, an automatic gain control loop according the present invention preferably comprises
  a switching control unit which generates a switching control signal to switch said switchable lowpass filter to said low time constant in case a change of the gain control signal of the automatic gain control loop lies above a predetermined threshold, and supplies said switching control signal to said switchable lowpass filter through said hold unit.

Preferably, said switching control unit comprises a differentiator receiving said gain control signal and a threshold decision unit receiving said differentiated gain control signal and supplying said switching control signal in case said differentiated gain control signal lies above a predetermined threshold.

Further alternatively or additionally, an automatic gain control loop according the present invention preferably comprises a switchable lowpass filter which is switchable to more than two different time constants to enable a switching dependent on more than one predetermined threshold.

The receiver according to the present invention comprises an automatic gain control loop according the present invention as defined above.

The receiver according to the present invention is preferably adapted to radio signals according to one of the standards DRM, DAB, FM, AM, or ISDB-Tn.

The method for automatic gain control with a gain control loop for a radio receiver according to the present invention, which radio receiver comprises a switchable lowpass filter to reduce distortions in an analogue gain control signal, comprises the steps of switching said switchable lowpass filter to a low time constant in case a change of a gain control signal of the automatic gain control loop lies above a predetermined threshold, which low time constant is lower than a normally used time constant, and affecting that said switchable lowpass filter uses said low time constant a predetermined time after a change of the gain control signal of the automatic gain control loop lies below said predetermined threshold.

The method according to the present invention preferably comprises the steps of:
  generating an analogue output signal which equals to an analogue input signal of the automatic gain control loop amplified according to the analogue gain control signal,
  converting the analogue output signal to a digital output signal,
  determining a digital gain control signal on basis of the digital output signal, and
  converting the digital gain control signal to said analogue gain control signal which is filtered by said switchable lowpass filter before being used to generate said analogue output signal.

Alternatively or additionally, the method according to the present invention comprises the step of generating a switching control signal to switch said switchable lowpass filter to said low time constant in case a change of the gain control signal of the automatic gain control loop lies above a predetermined threshold, and supplying said switching control signal to said switchable lowpass filter until a predetermined time after a change of the gain control signal of the automatic gain control loop lies below said predetermined threshold.

Further alternatively or additionally, in the method according to the present invention said switchable lowpass filter is preferably switchable to more than two different time constants to enable a switching dependent on more than one predetermined threshold.

The computer program product according to the present invention comprises computer program means adapted to perform the method steps according to the present invention as defined above or any step thereof when being executed on a computer, digital signal processor or the like.

Therefore, according to the present invention the tracking of the AGC loop is drastically increased by the insertion of a hold time element. This hold time element holds the low time constant Tau for a predetermined time after the differential part of the AGC loop output signal is low. The hold counter is started by the differential part of the AGC output signal.

Further features and advantages of the present invention will become apparent on basis of the following detailed description of a preferred embodiment according to the present invention taken in conjunction with the accompanying figures, in which FIG. 1 shows a block diagram of the automatic gain control unit according to a preferred embodiment of the present invention;

Figure 3:
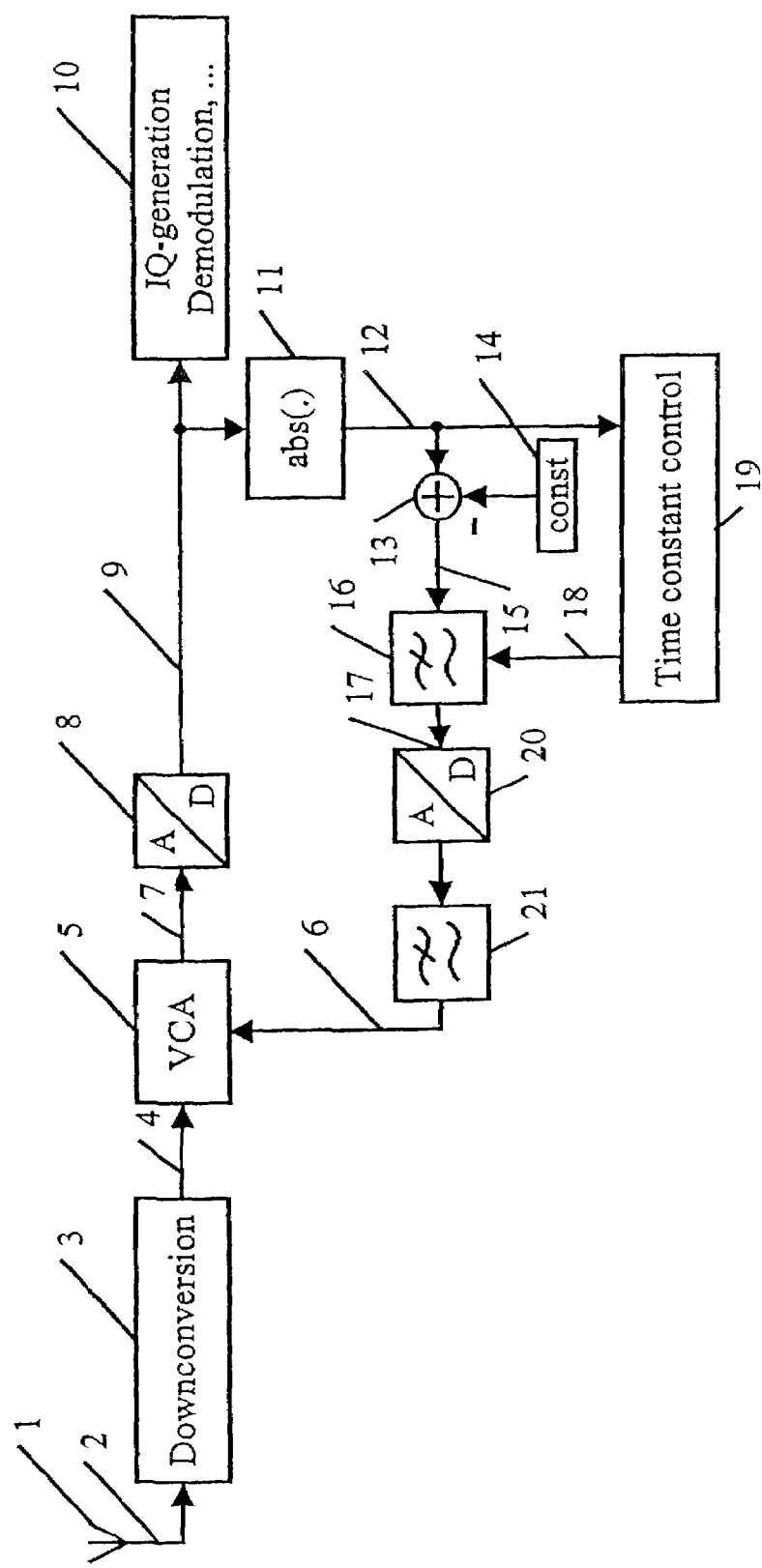
FIG. 3 shows a block diagram of an automatic gain control unit according to the prior art.
Figure 4:
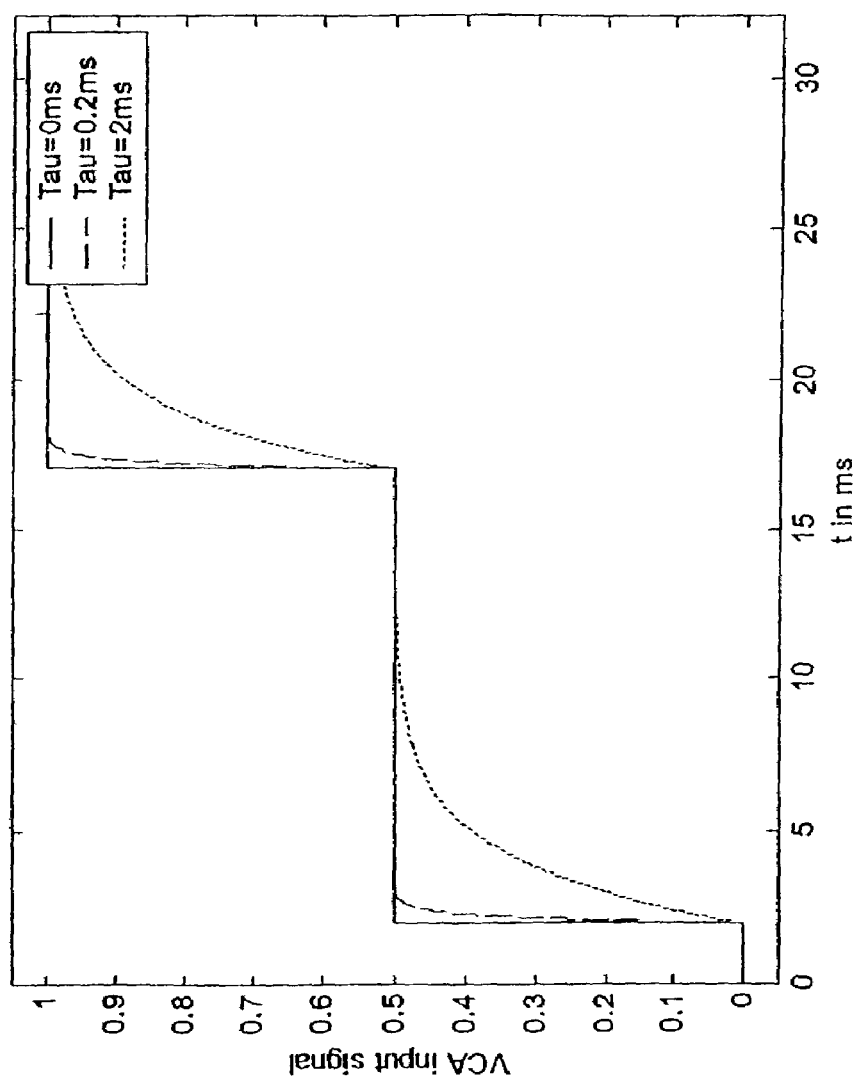
Figure 5:
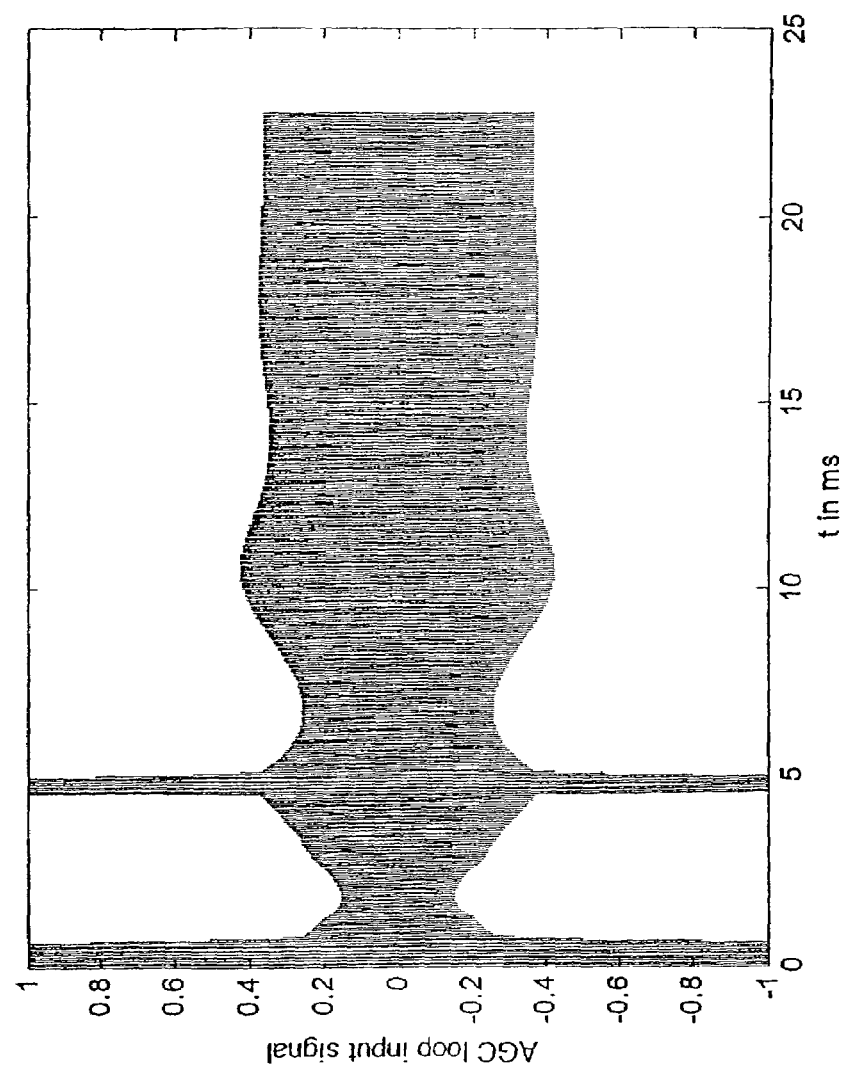

FIG. 4 shows different analogue gain control signals input to the VCA for different time constants Tau of the analogue filter used to filter the analogue gain control signal for different output levels thereof; and FIG. 5 shows the output signal of the AGC loop shown in FIG. 3 for a 20 dB change of the AGC loop input signal in case the time constant of the analogue lowpass filter 21 is switched without the hold unit 24 according to the present invention.

Figure 1:
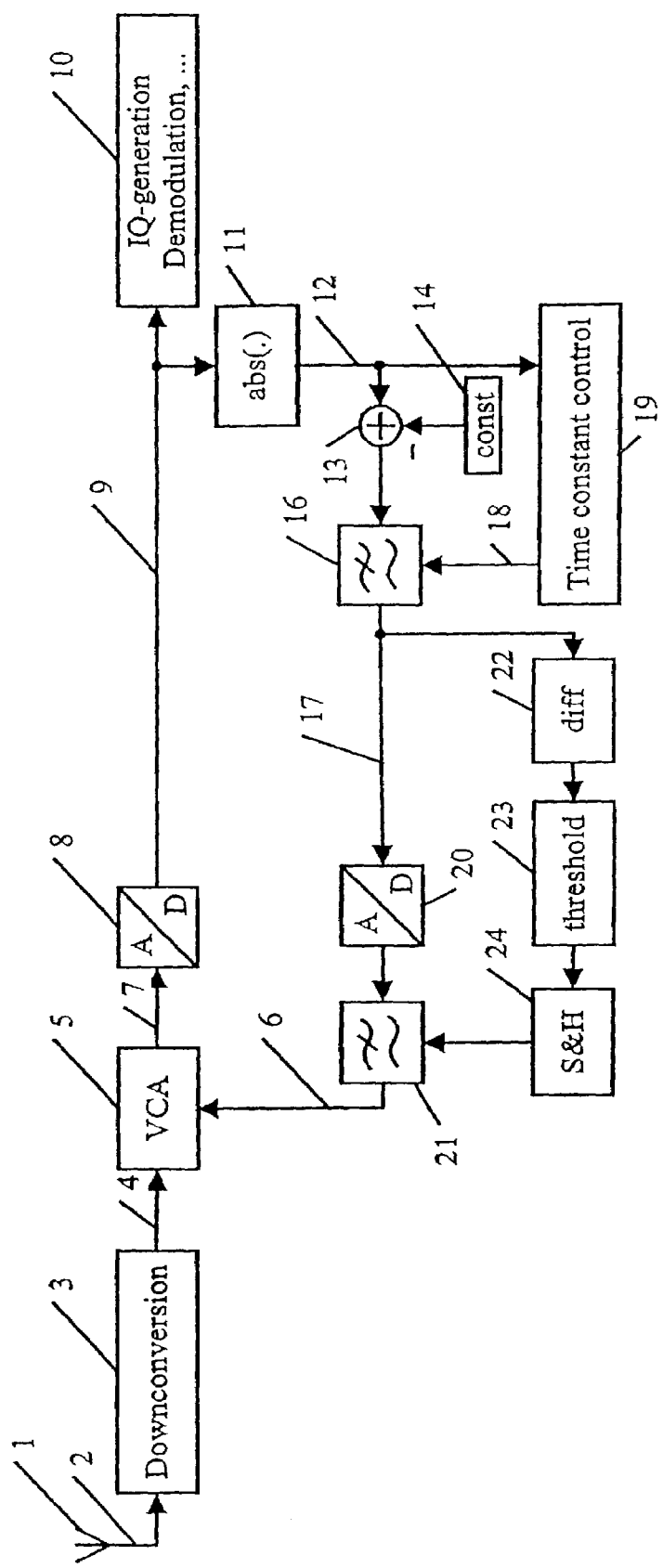

FIG. 1 depicts a block diagram of a AGC loop according to a preferred embodiment of the present invention. In comparison to the prior art AGC loop shown in FIG. 3, the shown AGC loop according to the present invention additionally comprises a switching control unit 22, 23 receiving said digital gain control signal 17 and supplying a switching control signal in case said differentiated gain control signal lies above a predetermined threshold to switch said switchable lowpass filter to a low time constant Tau. Preferably, the shown AGC loop according to the present invention comprises a sample and hold unit (24) to hold the switching control signal for a predetermined time also after the switching control signal does not indicate to switch to said low time constant Tau any more, i.e. "to hold the switched time constant" for a predetermined time.

The switching control unit comprises a differentiator 22 to differentiate the analogue AGC control signal 17 and a threshold decision unit 23 to compare the amplitude of the differential signal with a threshold. Based on this comparison the low time constant of the analogue filter is selected. As mentioned above, in case the low time constant is chosen, the sample and hold (S&H) unit 24 holds the low time constant for a predetermined time.

Of course, said switchable lowpass filter 21 might be switchable to more than two different time constants to enable a switching dependent on more than one predetermined threshold. As in the before described case, also in this case the sample and hold unit 24 holds a lower time constant for a predetermined time before switching to a higher time constant.

This S&H unit 24 allows a fast and correct tracking of the AGC loop in combination with low distortions in the gain controlled ADC input signal.

Figure 2:
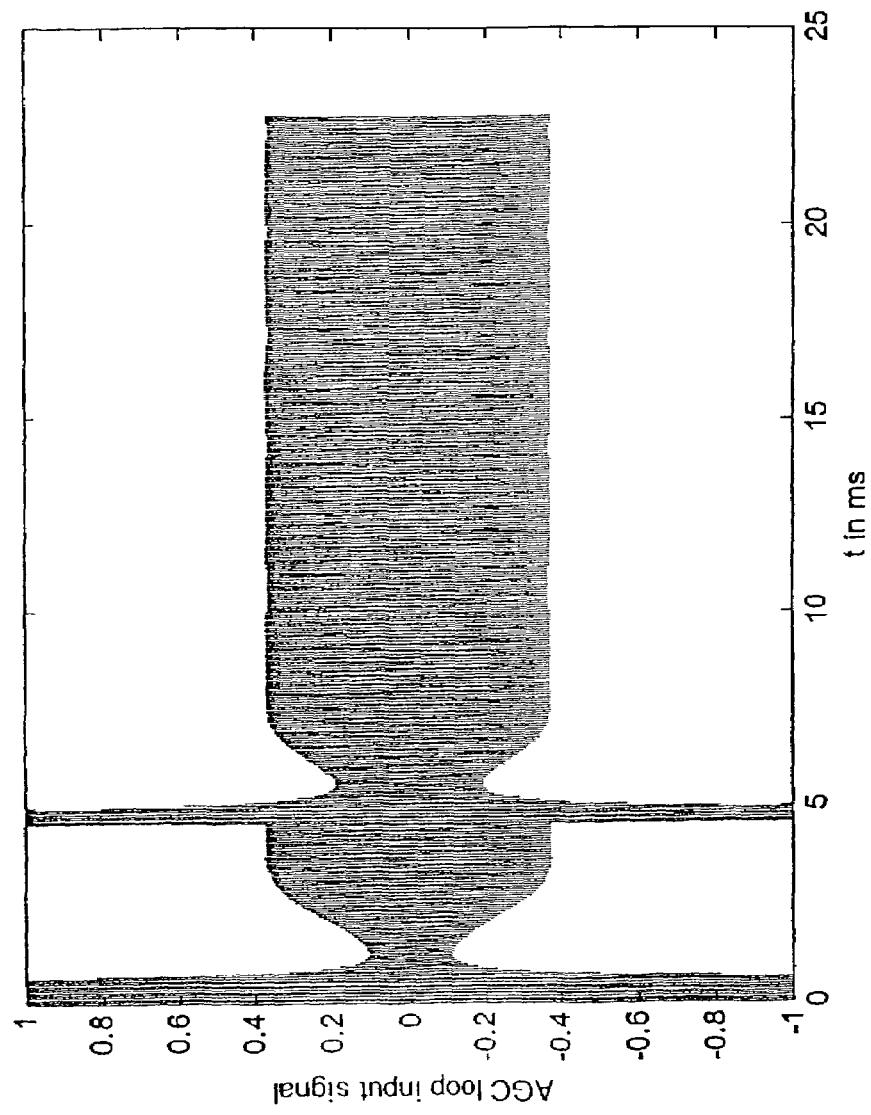
FIG. 2 shows the output signal of the AGC loop shown in FIG. 1 for a 20 dB change of the AGC loop input signal.

FIG. 2 depicts the ADC output signal of the AGC loop according to the present invention which comprises the hold unit 24 for the same input signal as depicted in FIG. 5. In contrast to the prior art AGC loop, the AGC loop according to the present invention shows a very short response time, here approximately 2 ms are needed after the 20 dB increase of the amplitude of the sinusoidal signal until the output signal is controlled to its desired level of 0.375.

What is claimed is:

1. An automatic gain control loop for a radio receiver, comprising
   a voltage controlled amplifier receiving an analog input signal of the automatic gain control loop and a gain control signal to output an analog output signal which equals to the analog input signal of the automatic gain control loop amplified according to the analog gain control signal,
   an analog/digital converter receiving the analog output signal and converting it to a digital output signal,
   a digital control circuit to determine a digital gain control signal on basis of the digital output signal,
   a digital/analog converter receiving the digital gain control signal and converting it to said analog gain control signal,
   a switchable lowpass filter receiving said analog gain control signal and generating said gain control signal which is filtered by said switchable lowpass filter before being supplied to said voltage controlled amplifier,
   a switching control unit receiving said digital gain control signal and generating a switching control signal for switching said switchable lowpass filter to a low time constant which is lower than a predetermined time constant, said switching control unit including a differentiator receiving said digital gain control signal, and a threshold decision unit supplying said switching control signal in case a change of the gain, control, signal of the automatic gain control loop lies above a predetermined threshold, and
   a hold unit which switches the time constant of said switchable lowpass filter after said change of the gain control signal lies below said predetermined threshold to a low time constant, which holds said low time constant for a predetermined time and which switches to a higher or another time constant after said predetermined time.

2. The automatic gain control loop according to claim 1, wherein said switchable lowpass filter is switchable to more than two different time constants to enable a switching dependent on more than one predetermined threshold.

3. A receiver, comprising an automatic gain control loop according to claim 1.

4. The receiver according to claim 3, further configured to receive radio signals according to one of DRM, DAB, FM, AM, or ISDR-Tn transmission formats.

5. A method for automatic gain control with a gain control loop for a radio receiver, comprising the steps of
   generating an analog output signal equal to an analog input signal of the automatic gain control loop amplified according to the analog gain control signal,
   converting the analog output signal to a digital output signal,
   determining a digital gain control signal on basis of the digital output signal, and
   converting the digital gain control signal to said, analog gain control signal which is filtered by a switchable lowpass filter before being used as gain control signal to generate said analog output signal, generating a switching control signal for switching said switchable lowpass filter to a low time constant which is lower than a predetermined time constant by differentiating said digital gain control signal, and by supplying said switching control signal to said switchable lowpass filter for switching the switchable lowpass filter to a low time constant when a change of a gain control signal of the automatic gain control loop lies above a predetermined threshold, and switching said switchable lowpass filter after said change of the gain control signal lies below said predetermined threshold to a low time constant, holding said low time constant for a predetermined time and switching to a higher or another time constant after said predetermined time.

6. The method according to claim 5, wherein said step of switching includes switching said switchable low-pass filter to more than two different time constants to enable a switching dependent on more, than one predetermined threshold.

7. A computer program product adapted to be fixed on a storage medium, comprising computer program means adapted to cause a computer, digital signal processor or calculating device to perform the method steps as defined in one of claims 5–6.

* * * * *